(12) United States Patent
Azadet et al.

(10) Patent No.: US 9,529,567 B2
(45) Date of Patent: Dec. 27, 2016

(54) DIGITAL PROCESSOR HAVING INSTRUCTION SET WITH COMPLEX EXPONENTIAL NON-LINEAR FUNCTION

(71) Applicant: Intel Corporation, Santa Clara, CA (US)

(72) Inventors: Kameran Azadet, Pasadena, CA (US); Albert Molina, Novelda (ES); Joseph H. Othmer, Ocean, NJ (US); Parakalan Venkataraghavan, Bangalore (IN); Meng-Lin Yu, Morganville, NJ (US); Joseph Williams, Holmdel, NJ (US)

(73) Assignee: Intel Corporation, Santa Clara, CA (US)

( * ) Notice: Subject to any disclaimer, the term of this patent is extended or adjusted under 35 U.S.C. 154(b) by 517 days.

(21) Appl. No.: 13/701,397

(22) PCT Filed: Oct. 26, 2012

(86) PCT No.: PCT/US2012/062191
§ 371 (c)(1),
(2) Date: Apr. 23, 2013

(87) PCT Pub. No.: WO2013/063447
PCT Pub. Date: May 2, 2013

(65) Prior Publication Data
US 2014/0075162 A1    Mar. 13, 2014

Related U.S. Application Data

(60) Provisional application No. 61/552,242, filed on Oct. 27, 2011.

(51) Int. Cl.
*G06F 9/30* (2006.01)
*G06F 5/01* (2006.01)
(Continued)

(52) U.S. Cl.
CPC ............... *G06F 5/01* (2013.01); *G06F 9/3001* (2013.01); *G06F 9/30036* (2013.01);
(Continued)

(58) Field of Classification Search
None
See application file for complete search history.

(56) References Cited

U.S. PATENT DOCUMENTS 5,276,633 A * 1/1994 Fox et al. ..................... 708/276
5,864,689 A    1/1999 Tran
(Continued)

FOREIGN PATENT DOCUMENTS

JP    2000-200261 A    7/2000

OTHER PUBLICATIONS

Haber, "The complex logarithm, exponential and power functions", Winter 2011, http://scipp.ucsc.edu/~haber/ph116A/clog_11.pdf.*
(Continued)

*Primary Examiner* — Steven Snyder
(74) *Attorney, Agent, or Firm* — Nicholson De Vos Webster & Elliott LLP

(57) ABSTRACT

A digital processor is provided having an instruction set with a complex exponential function. The digital processor evaluates a complex exponential function for an input value, x, by obtaining a complex exponential software instruction having the input value, x, as an input; and in response to the complex exponential software instruction: invoking at least one complex exponential functional unit that implements complex exponential software instructions to apply the complex exponential function to the input value, x; and generating an output corresponding to the complex exponential of the input value, x. A complex exponential function for an input value, x, can be evaluated by wrapping the input value to maintain a given range; computing a coarse
(Continued)

approximation angle using a look-up table; scaling the coarse approximation angle to obtain an angle from 0 to θ; and computing a fine corrective value using a polynomial approximation.

26 Claims, 4 Drawing Sheets

(51) Int. Cl.
*H04B 1/04* (2006.01)
*H04L 1/00* (2006.01)
*H04L 27/233* (2006.01)
*H04B 1/62* (2006.01)
*H04L 25/02* (2006.01)
*H04L 25/03* (2006.01)
*H03M 3/00* (2006.01)
*H03F 1/02* (2006.01)
*H03F 1/32* (2006.01)
*H03F 3/189* (2006.01)
*H03F 3/24* (2006.01)
*H04B 1/00* (2006.01)

(52) U.S. Cl.
CPC ......... *H03F 1/0288* (2013.01); *H03F 1/3241* (2013.01); *H03F 1/3258* (2013.01); *H03F 3/189* (2013.01); *H03F 3/24* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03* (2013.01); *H04L 25/03178* (2013.01); *H04L 25/03216* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01)

(56) References Cited

U.S. PATENT DOCUMENTS

| | | | |
|---|---|---|---|
| 5,926,406 A | 7/1999 | Tucker et al. | |
| 5,990,894 A | 11/1999 | Hu et al. | |
| 6,018,556 A | 1/2000 | Janesch et al. | |
| 6,038,582 A * | 3/2000 | Arakawa | G06F 7/509 |
| | | | 708/501 |
| 6,128,638 A | 10/2000 | Thomas | |
| 6,151,682 A | 11/2000 | Van Der Wal et al. | |
| 6,446,193 B1 | 9/2002 | Alidina et al. | |
| 6,529,992 B1 | 3/2003 | Thomas | |
| 6,741,662 B1 | 5/2004 | Francos et al. | |
| 6,844,880 B1 | 1/2005 | Lindholm et al. | |
| 7,110,477 B2 * | 9/2006 | Suissa et al. | 375/334 |
| 7,441,105 B1 | 10/2008 | Metzgen | |
| 7,461,116 B2 | 12/2008 | Allen | |
| 7,715,656 B2 | 5/2010 | Zhou | |
| 7,752,419 B1 | 7/2010 | Plunkett et al. | |
| 7,912,883 B2 | 3/2011 | Hussain | |
| 8,783,140 B2 * | 7/2014 | Dick | B23D 45/14 |
| | | | 83/13 |
| 2003/0041083 A1 | 2/2003 | Jennings, III et al. | |
| 2003/0154226 A1 | 8/2003 | Khmelnik | |
| 2004/0073588 A1 | 4/2004 | Jennings, III | |
| 2005/0008096 A1 | 1/2005 | Iwasaki et al. | |
| 2005/0065990 A1 | 3/2005 | Allen | |
| 2005/0108002 A1 * | 5/2005 | Nagai et al. | 704/203 |
| 2005/0177605 A1 | 8/2005 | Sudhakar | |
| 2005/0182811 A1 | 8/2005 | Jennings et al. | |
| 2007/0112902 A1 | 5/2007 | Dance et al. | |
| 2009/0006514 A1 * | 1/2009 | Kountouris | 708/276 |
| 2009/0037504 A1 | 2/2009 | Hussain | |
| 2009/0079599 A1 * | 3/2009 | McGrath | H03H 17/0422 |
| | | | 341/61 |
| 2010/0138468 A1 * | 6/2010 | Azadet et al. | 708/511 |
| 2010/0198893 A1 * | 8/2010 | Azadet et al. | 708/209 |
| 2010/0198894 A1 * | 8/2010 | Azadet et al. | 708/209 |
| 2011/0055303 A1 | 3/2011 | Slavin | |
| 2011/0056344 A1 * | 3/2011 | Dick | B23D 45/14 |
| | | | 83/13 |
| 2011/0302230 A1 * | 12/2011 | Ekstrand | 708/201 |
| 2013/0211576 A1 * | 8/2013 | Dick | B23D 45/14 |
| | | | 700/180 |
| 2015/0073579 A1 * | 3/2015 | Dick | B23D 45/14 |
| | | | 700/114 |

OTHER PUBLICATIONS

Walter Penney, A 'Binary' System for Complex Numbers, Nov. 29, 2011, NSA, https://www.nsa.gov/public_info/_files/tech_journals/A_Binary_System.pdf.*

Office action with summarized English translation from Japanese Patent Application No. 2014-539061, mailed May 24, 2016, 6 pages.

* cited by examiner

DIGITAL PROCESSOR HAVING INSTRUCTION SET WITH COMPLEX EXPONENTIAL NON-LINEAR FUNCTION

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

The present application is related to U.S. patent application Ser. No. 12/324,926, entitled "Digital Signal Processor Having Instruction Set with One or More Non-Linear Complex Functions;" and U.S. patent application Ser. No. 12/362,879, entitled "Digital Signal Processor Having Instruction Set With An Exponential Function Using Reduced Look-Up Table," each filed Nov. 28, 2008 and incorporated by reference herein.

FIELD OF THE INVENTION

The present invention is related to digital processing techniques and, more particularly, to techniques for digital processing of complex exponential functions.

BACKGROUND OF THE INVENTION

Digital signal processors (DSPs) are special-purpose processors utilized for digital processing. Signals are often converted from analog form to digital form, manipulated digitally, and then converted back to analog form for further processing. Digital signal processing algorithms typically require a large number of mathematical operations to be performed quickly and efficiently on a set of data.

DSPs thus often incorporate specialized hardware to perform software operations that are often required for math-intensive processing applications, such as addition, multiplication, multiply-accumulate (MAC), and shift-accumulate. A Multiply-Accumulate architecture, for example, recognizes that many common data processing operations involve multiplying two numbers together, adding the resulting value to another value and then accumulating the result. Such basic operations can be efficiently carried out utilizing specialized high-speed multipliers and accumulators.

A vector processor implements an instruction set containing instructions that operate on vectors (i.e., one-dimensional arrays of data). The scalar DSPs, on the other hand, have instructions that operate on single data items. Vector processors offer improved performance on certain workloads.

DSPs and vector processors, however, generally do not provide specialized instructions to support complex exponential functions. Increasingly, however, there is a need for complex exponential operations in processors. For example, complex exponential operations are needed when a first complex number is multiplied by a second complex number. The complex exponential function is important as it provides a basis for periodic signals as well as being able to characterize linear, time-invariant signals.

A need therefore exists for digital processors, such as DSPs and vector processors, having an instruction set that supports a complex exponential function.

SUMMARY OF THE INVENTION

Generally, a digital processor is provided having an instruction set with a complex exponential function. According to one aspect of the invention, the disclosed digital processor evaluates a complex exponential function for an input value, x, by obtaining one or more complex exponential software instructions having the input value, x, as an input; and in response to at least one of the complex exponential software instructions, perform the following steps: invoking at least one complex exponential functional unit that implements the one or more complex exponential software instructions to apply the complex exponential function to the input value, x; and generating an output corresponding to the complex exponential of the input value, x.

According to another aspect of the invention, the disclosed digital processor evaluates a complex exponential function for an input value, x by wrapping the input value to maintain a given range; computing a coarse approximation angle using a look-up table using a number of most significant bits (MSBs) of the input value; scaling the coarse approximation angle to obtain an angle from 0 to $\partial$; and computing a fine corrective value using a polynomial approximation. The polynomial approximation comprises, for example, a Taylor Series, such as a cubic approximation.

The digital processor executes software instructions from program code and can be, for example, a vector processor or a scalar processor. In one variation, symmetry properties are used to reduce a size of the look-up table. In addition, an angle can optionally be accumulated within the complex exponential function and a complex exponential of an argument and/or a current accumulation value can be returned. In another variation, an input signal is multiplied by an exponential of an argument of the complex exponential function.

A more complete understanding of the present invention, as well as further features and advantages of the present invention, will be obtained by reference to the following detailed description and drawings.

DETAILED DESCRIPTION

Aspects of the present invention provide a digital processor that supports a complex exponential function using a two-step coarse and fine estimate approach. Generally, one or more look-up tables store coarse estimate values for at least a portion of the computation of a complex exponential function, such as exp $(j*2*\pi*x)$. Further aspects of the present invention recognize that a Taylor series approximation can be employed to compute a fine correction for the complex exponential function when the dynamic range of the input value is limited, as discussed further below.

As used herein, the term "digital processor" shall be a processor that executes instructions in program code, such as a DSP or a vector processor. It is further noted that the disclosed complex exponential function can be applied for values of x that are scalar or vector inputs.

The present invention can be applied in handsets, base stations and other network elements.

Figure 1:
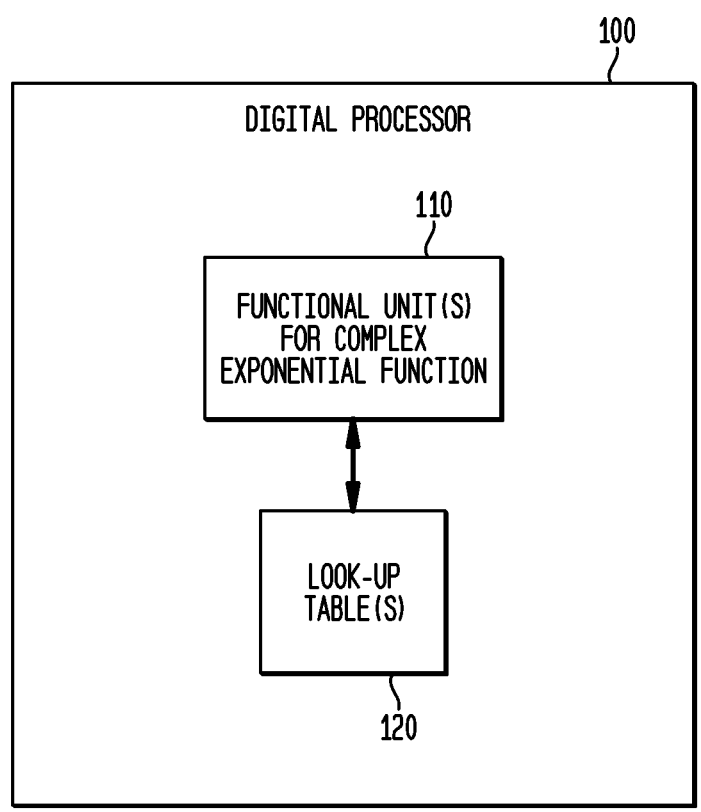
FIG. 1 is a schematic block diagram of an exemplary digital processor that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes one or more functional units 110 for complex exponential functions. In addition, the digital processor 100 comprises one or more look-up tables 120 that store values for computing a coarse estimate of the complex exponential function, as discussed further below in conjunction with FIG. 3.

Generally, if the digital processor 100 is processing software code that includes a predefined instruction keyword corresponding to a complex exponential function and any appropriate operands for the function, the instruction decoder must trigger the appropriate complex exponential functional units 110 that is required to process the instruction. It is noted that a complex exponential functional unit 110 can be shared by more than one instruction.

Generally, aspects of the present invention extend conventional digital processors to provide an enhanced instruction set that supports complex exponential functions using one or more look-up tables. The digital processor 100 in accordance with aspects of the present invention receives at least one real number as an input, applies a complex exponential function to the input and generates an output value.

The disclosed digital processors 100 may have a scalar architecture, as shown in FIG. 1, that processes a single number at a time, or a vector architecture, as discussed hereinafter in conjunction with FIG. 4, that processes one or more numbers simultaneously. In the case of a vector-based digital processor implementation, the input number is a vector comprised of a plurality of scalar numbers that are processed in parallel.

The disclosed complex exponential functions may be employed, for example, for digital up-conversion or modulation of baseband signals and other signal processing requiring the multiplication of two numbers, such as Fast Fourier Transform (FFT) algorithms.

Figure 2:
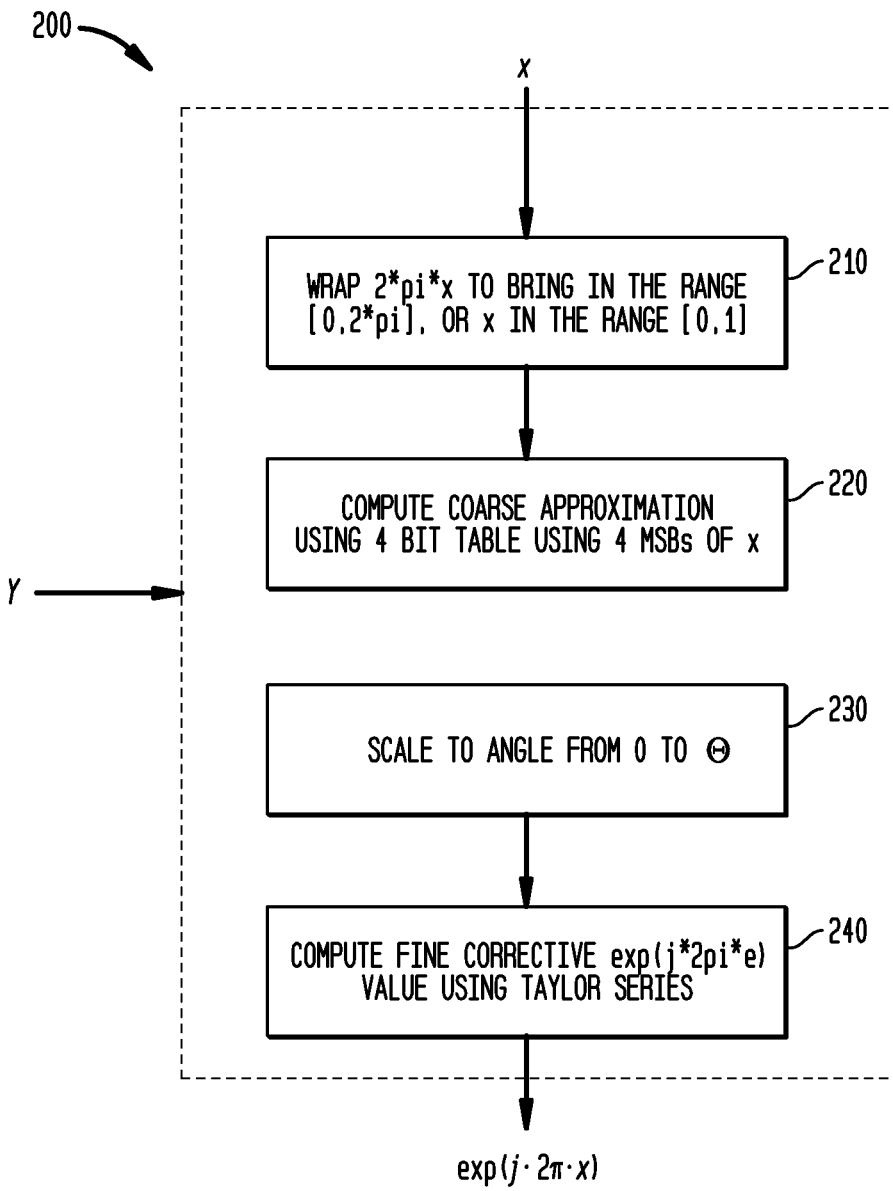
FIG. 2 is a flow chart describing an exemplary implementation of a complex exponential function computation process that incorporates features of the present invention.

FIG. 2 is a flow chart describing an exemplary implementation of a complex exponential function computation process 200 that incorporates features of the present invention to compute $\exp(j*2*\pi*x)$. Generally, the exemplary complex exponential function computation process 200 implements a two step approach, where a coarse estimate is initially obtained and then corrected using a fine estimate.

As shown in FIG. 2, the exemplary complex exponential function computation process 200 initially wraps the $2*\pi*x$ input value during step 210 to bring it in the range $[0,2*\pi]$, for example, using a modulo operation, or alternatively wraps x in the range $[0,1]$. Thereafter, the complex exponential function computation process 200 computes a coarse approximation angle during step 220 using a 4 bit look-up table 120 using the 4 most significant bits (MSBs) of x, as discussed further below in conjunction with FIG. 3.

During step 230, the complex exponential function computation process 200 scales the angular result of step 220 to obtain an angle from 0 to $\theta$, where $\theta$ is a small value. Finally, during step 240, the complex exponential function computation process 200 computes a fine corrective $\exp(j*2\pi*\epsilon)$ value using a Taylor Series, as discussed further below. It has been found that a quadratic Taylor Series expansion gives sufficient accuracy compared to a 2K table.

Mathematically, the operations performed by the complex exponential function computation process 200 can be expressed as follows:

$$2\pi \cdot x \leftarrow 2\pi \cdot x \bmod [2\pi] \quad (1)$$

$$x = x_0 + \epsilon \quad (2)$$

The first term in equation (2) provides a value in the range 0 to 15/16 and the second term in equation (2) provides a value that is below $1/16$. Equation (2) can be expressed as follows:

$$\exp(j2\pi \cdot x) = \exp(j2\pi \cdot x_0) \cdot \exp(j2\pi \cdot \epsilon) \quad (3)$$

The first term in equation (3) is the coarse phase estimate obtained from the look-up table 120, as discussed further below in conjunction with FIG. 3. The second term in equation (3) provides a residual phase or fine correction value computed using the Taylor Series expansion.

Figure 3:
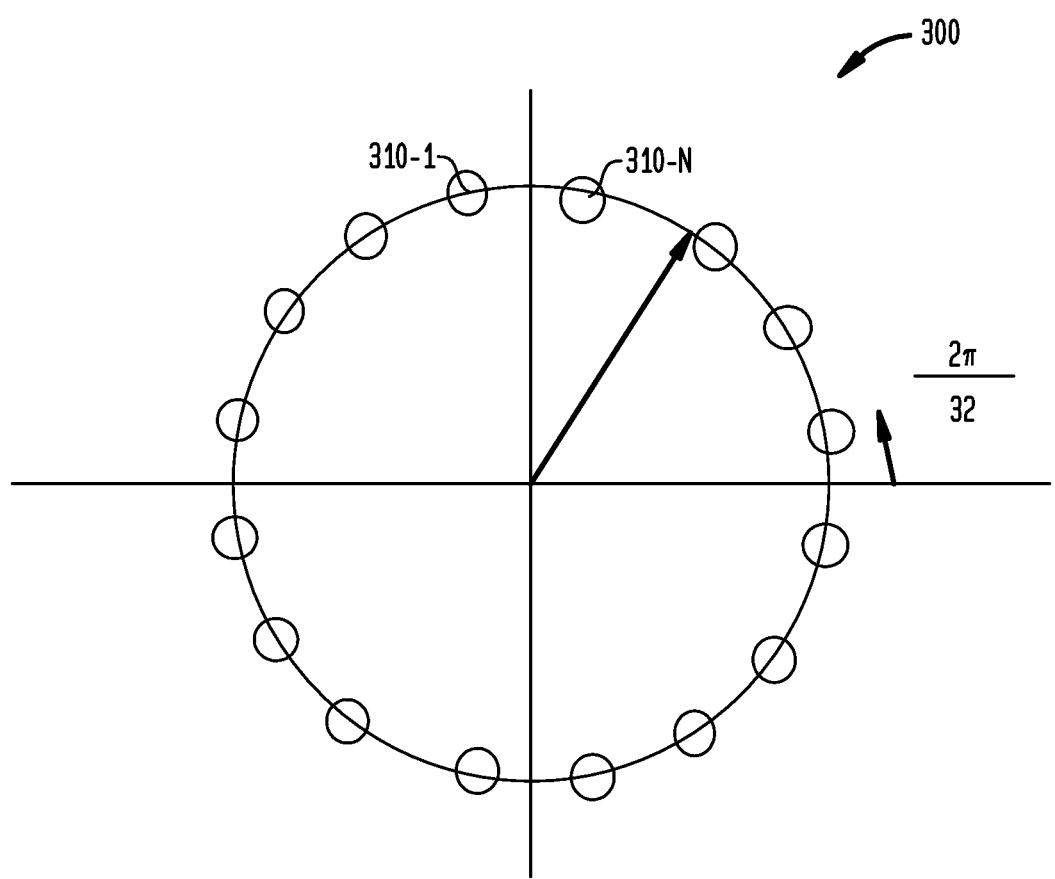
FIG. 3 illustrates the computation of a coarse estimate for the complex exponential using a look up table.

FIG. 3 illustrates the computation of a coarse phase estimate for the complex exponential using a look up table. As shown in FIG. 3, the 4 MSBs are translated to an angle using a circular diagram 300, where the four bit value identifies one entry 310 in the look-up table 120.

Polynomial Approximation of Complex Exponential Functions

Aspects of the present invention recognize that a fine correction for the complex exponential function can be approximated using a Taylor series. Thus, a complex exponential function, $\exp(j*2*pi*x)$, can be expressed as:

$$\exp(j*2*\pi*\varepsilon) = 1 + j*2*\pi*\varepsilon + \frac{(j*2*\pi*\varepsilon)^2}{2!} + \frac{(j*2*\pi*\varepsilon)^3}{3!} + \ldots \quad (4)$$

In addition, the present invention recognizes that a cubic approximation (i.e., including up to $x^3$ in the Taylor series) or a quadratic approximation (i.e., including up to $x^4$ in the Taylor series) typically provides sufficient accuracy. The following table illustrates the exemplary error for cubic and quadratic approximations, in comparison to a 2K look-up table:

| | 2K table (0 to pi/2) | Quadratic (4b table 0-2pi) | Quadratic (4b table 0-pi/2) | Cubic (4b table 0-2pi) | Cubic (4b table 0-pi/2) |
|---|---|---|---|---|---|
| Max absolute error | 3.8e−4 | 1.2e−3 | 2e−5 | 6.2e−5 | 2.4e−7 |

Figure 4:
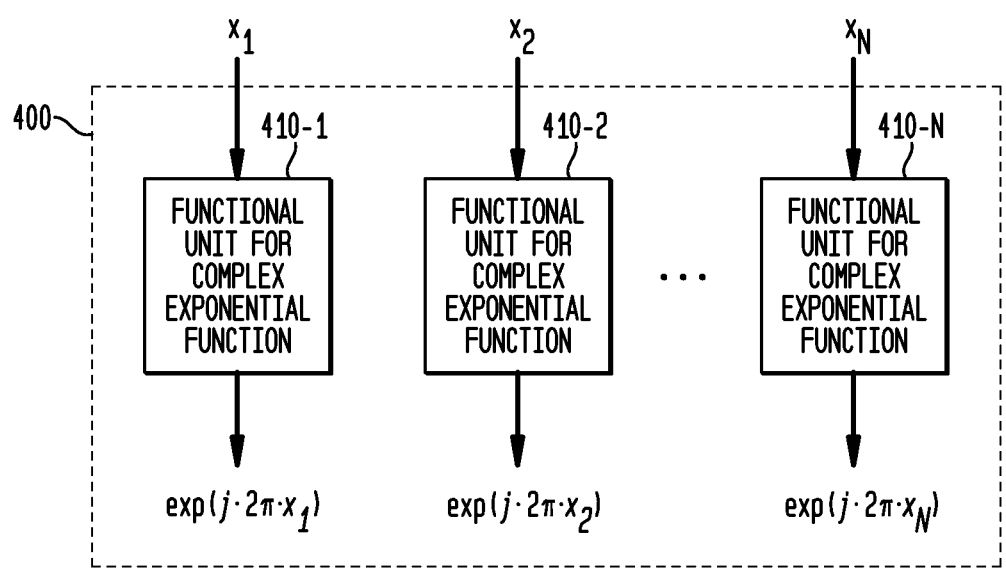
FIG. 4 is a schematic block diagram of an exemplary vector-based digital processor that processes one or more real numbers simultaneously in accordance with an embodiment of the present invention.

FIG. 4 is a schematic block diagram of an exemplary vector-based digital processor 400 that processes one or more numbers simultaneously in accordance with an embodiment of the present invention. Generally, the vector-based implementation of FIG. 4 increases the number of MIPS (instructions per second), relative to the scalar implementation of FIG. 1, by performing different processes concurrently. Thus, the vector-based digital processor 400 contains plural functional units for complex exponential functions 310-1 through 310-N. For example, a dual digital processor 400 contains two functional units 310-1 and 310-2 that are capable of performing two independent complex exponential function operations concurrently.

Generally, the vector-based digital processor 400 processes a vector of inputs x and generates a vector of outputs, exp(j·2π·x) The exemplary vector-based digital processor 400 is shown for a 16-way vector processor expj instruction implemented as:

vec_expj(x1, x2, . . . , x16), range of x[k] from 0 to 1

In one variation, the size of the look-up table can be reduced by making use of symmetry. For example, a sine wave oscillates up and down, so top and bottom symmetry can be leveraged to reduce the look-up table in half (0 to π/2) or even using quarter symmetry (0 to π/4). In yet another variation, the complex exponential function can accumulate an angle within the function (i.e., the function also performs an increment of the angle that is applied to the input data, by a fixed amount or an angular amount passed with the function call). The complex exponential function with angular accumulation can return two results, the argument of the exponential and the current accumulation.

In another variation, the disclosed complex exponential (j–Θ) function can also be employed for modulation to multiply an input signal x by the exponential of the argument j–Θ. This operation can optionally be performed by the complex exponential instruction (or a Complex Multiply-Accumulate (CMAC) unit) so that the exponential of the argument is computed and the result is multiplied by the input signal x.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method performed by a digital processor for evaluating a complex exponential function for an input value, x, comprising:
    obtaining a single complex exponential software instruction having said input value, x, as an input operand; and
    in response to said single complex exponential software instruction,
    invoking at least one complex exponential functional unit that implements said single complex exponential software instruction, to apply said complex exponential function to said input value, x, by
        wrapping said input value to maintain a given range,
        computing a coarse approximation angle using a look-up table using a number of most significant bits (MSBs) of said input value,
        scaling said coarse approximation angle to obtain an angle from 0 to Θ, and
        computing a fine corrective value using a polynomial approximation to generate an output corresponding to said complex exponential of said input value, x.

2. The method of claim 1, wherein said digital processor executes software instructions from program code.

3. The method of claim 1, wherein said digital processor comprises one or more of a vector processor and a scalar processor.

4. The method of claim 1, further comprising the steps of accumulating an angle within said complex exponential function and returning one or more of a complex exponential of an argument and a current accumulation value.

5. The method of claim 1, further comprising the step of multiplying an input signal by an exponential of an argument of said complex exponential function.

6. A method performed by a digital processor for evaluating a complex exponential function for an input value, x, said method comprising:
    wrapping said input value to maintain a given range;
    computing a coarse approximation angle using a look-up table using a number of most significant bits (MSBs) of said input value;
    scaling said coarse approximation angle to obtain an angle from 0 to Θ; and
    computing a fine corrective value using a polynomial approximation.

7. The method of claim 6, wherein said polynomial approximation comprises a Taylor Series.

8. The method of claim 6, wherein said polynomial approximation is a cubic approximation.

9. The method of claim 6, wherein said digital processor executes software instructions from program code.

10. The method of claim 6, wherein said digital processor comprises one or more of a vector processor and a scalar processor.

11. The method of claim 6, further comprising the step of employing symmetry properties to reduce a size of said look-up table.

12. The method of claim 6, further comprising the steps of accumulating an angle within said complex exponential function and returning one or more of a complex exponential of an argument and a current accumulation value.

13. The method of claim 6, further comprising the step of multiplying an input signal by an exponential of an argument of said complex exponential function.

14. A digital processor that evaluates a complex exponential function for an input value, x, comprising:
    a memory; and
    at least one hardware device, coupled to the memory, operative to:
        obtain a single complex exponential software instruction having said input value, x, as an input operand and in response to said single complex exponential software instruction,
        invoke at least one complex exponential functional unit that implements said single complex exponential software instruction, to apply said complex exponential function to said input value, x, to wrap said input value to maintain a given range, compute a coarse approximation angle using a look-up table using a number of most significant bits (MSBs) of said input value, scale said coarse approximation angle to obtain an angle from 0 to Θ, and compute a fine corrective value using a polynomial approximation to generate an output corresponding to said complex exponential of said input value, x.

15. The digital processor of claim 14, wherein said digital processor executes software instructions from program code.

16. The digital processor of claim 14, wherein said digital processor comprises one or more of a vector processor and a scalar processor.

17. The digital processor of claim 14, wherein said at least one hardware device is further configured to accumulate an angle within said complex exponential function and return one or more of a complex exponential of an argument and a current accumulation value.

18. The digital processor of claim 14, wherein said at least one hardware device is further configured to multiply an input signal by an exponential of an argument of said complex exponential function.

19. A digital processor that evaluates a complex exponential function for an input value, x, comprising:

a memory; and at least one hardware device, coupled to the memory, operative to:

wrap said input value to maintain a given range;

compute a coarse approximation angle using a look-up table using a number of most significant bits (MSBs) of said input value;

scale said coarse approximation angle to obtain an angle from 0 to Θ; and compute a fine corrective value using a polynomial approximation.

20. The digital processor of claim 19, wherein said polynomial approximation comprises a Taylor Series.

21. The digital processor of claim 19, wherein said polynomial approximation is a cubic approximation.

22. The digital processor of claim 19, wherein said digital processor executes software instructions from program code.

23. The digital processor of claim 19, wherein said digital processor comprises one or more of a vector processor and a scalar processor.

24. The digital processor of claim 19, wherein said at least one hardware device is further configured to employ symmetry properties to reduce a size of said look-up table.

25. The digital processor of claim 19, wherein said at least one hardware device is further configured to accumulate an angle within said complex exponential function and return one or more of a complex exponential of an argument and a current accumulation value.

26. The digital processor of claim 19, wherein said at least one hardware device is further configured to multiply an input signal by an exponential of an argument of said complex exponential function.

\* \* \* \* \*